United States Patent
Liu et al.

(10) Patent No.: US 7,965,213 B1
(45) Date of Patent: Jun. 21, 2011

(54) ELEMENT-SELECTING METHOD CAPABLE OF REDUCING TOGGLE RATE OF DIGITAL TO ANALOG CONVERTER AND MODULE THEREOF

(75) Inventors: Chang-Shun Liu, Taipei (TW); Tse-Chi Lin, Taipei County (TW); Yu-Hsuan Tu, Tainan (TW); Kang-Wei Hsueh, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/717,910

(22) Filed: Mar. 4, 2010

Related U.S. Application Data

(60) Provisional application No. 61/235,769, filed on Aug. 21, 2009.

(51) Int. Cl.
   *H03M 1/66* (2006.01)
(52) U.S. Cl. .................................. 341/144; 375/238
(58) Field of Classification Search ............ 341/90–155; 375/238, 245, 247, 316, 350
   See application file for complete search history.

(56) References Cited

U.S. PATENT DOCUMENTS

| | | | |
|---|---|---|---|
| 6,535,154 B1 * | 3/2003 | Sculley ...................... 341/143 |
| 6,628,218 B2 * | 9/2003 | Brooks et al. ................ 341/143 |
| 6,771,199 B2 * | 8/2004 | Brooks et al. ................ 341/143 |
| 6,930,626 B2 * | 8/2005 | Brooks et al. ................ 341/143 |
| 7,138,935 B1 * | 11/2006 | Damphousse et al. ........ 341/144 |
| 7,538,707 B2 * | 5/2009 | Sakurai et al. ............... 341/144 |
| 7,570,693 B2 * | 8/2009 | Mallinson et al. ............ 375/254 |

OTHER PUBLICATIONS

Iee, "Advancing Data Weighted Averaging Technique for Multi-Bit Sigma-Delta Modulators", IEEE Transactions on Circuits and Systems—II: Express Briefs, vol. 54, No. 10, Oct. 2007, pp. 838-842, Oct. 2007.

* cited by examiner

*Primary Examiner* — Lam T Mai
(74) *Attorney, Agent, or Firm* — Winston Hsu; Scott Margo

(57) ABSTRACT

An element-selecting method is utilized for selecting the converting elements of the DAC to perform the digital-to-analog conversion. The element-selecting method first determines whether the selected times of the converting elements are all equal or not. When the selected times of the converting elements are all equal, the element-selecting method determines a shifting-step according to the input signal and the number of the converting elements; otherwise, the element-selecting method determines the shifting-step to be a predetermined value. The element-selecting method then selects a converting element from the DAC by means of separating the converting element from a last selected converting element by the shifting-step. In this way, the error accumulated because of the mismatch of the converting elements is eliminated, and the toggle rate of the DAC is reduced. Hence, the glitch and the dynamic errors of the DAC are reduced, improving the performance of the DAC.

12 Claims, 4 Drawing Sheets

FIG. 3

ELEMENT-SELECTING METHOD CAPABLE OF REDUCING TOGGLE RATE OF DIGITAL TO ANALOG CONVERTER AND MODULE THEREOF

CROSS REFERENCE TO RELATED APPLICATIONS

This application claims the benefit of U.S. Provisional Application No. 61/235,769, filed on Aug. 21, 2009 and entitled "Low Toggle Rate Dynamic Element Matching Method" the contents of which are incorporated herein.

BACKGROUND OF THE INVENTION

1. Field of the Invention

The present invention relates to an element-selecting method, and more particularly, to an element-selecting method capable of reducing a toggle rate of a Digital to Analog Converter (DAC).

2. Description of the Prior Art

The DAC is utilized for converting a multi-bit digital input signal $S_{IN}$ into an analog output signal $S_{OUT}$. For example, the DAC has M converting elements $EL_1 \sim EL_M$, wherein M represents a positive integer. When the DAC receives the multi-bit digital input signal $S_{DI}$, a number of the converting elements of the converting elements $EL_1 \sim EL_M$ is selected for respectively outputting a unit signal and the unit signals are combined for forming the analog output signal $S_{OUT}$.

In the prior art, the element-selecting method, which is a Dynamic Element Matching (DEM) method, is utilized for reducing the noise generated by the mismatch of the converting elements of the DAC by means of balancing selected times of the converting elements of the DAC. However, when the noise-shaping ability of the element-selecting method is improved, the toggle rate, which means the averaged number of elements of DAC changing their states in one conversion step, of the DAC increases. Since the more converting elements toggle, the more glitch and dynamic errors are introduced into the analog output signal $S_{OUT}$. Hence, the performance of the DAC is degraded, causing a great inconvenience.

SUMMARY OF THE INVENTION

The present invention provides an element-selecting method. The element-selecting method is capable of reducing a toggle rate of a Digital to Analog Converter (DAC) while maintaining a good noise shaping ability and low toggle rate. The DAC is utilized for converting a multi-bit digital input signal into an analog output signal. The DAC has M converting elements. N converting elements of the M converting elements are selected to output N unit signals when the DAC receives the multi-bit digital input signal to form the analog output signal. The element-selecting method is utilized for selecting the N selected converting elements from the M converting elements. The element-selecting method comprises (a) determining a shifting-step according to a first predetermined value when selected numbers corresponding to the M converting elements are different, wherein the selected numbers respectively represent selected times that the M converting elements have been selected for performing the digital to analog conversion, (b) determining the shifting-step according to a number of the M converting elements and the multi-bit digital input signal when the M selected numbers are all equal, (c) selecting a converting element from the M converting elements by means of separating the selected converting elements from a last selected converting elements of the M converting elements by the shifting-step M represents a positive integer. N represents an integer, and $0 \leq N \leq M$.

The present invention further provides an element-selecting module. The element-selecting module is capable of reducing a toggle rate of a Digital to Analog Converter (DAC). The DAC is utilized for converting a multi-bit digital input signal into an analog output signal. The DAC has M converting elements. The element-selecting module selects N selected converting elements from the M converting elements to form the analog output signal. The element-selecting module comprises a step-calculating circuit and a selecting circuit. The step-calculating circuit is utilized for determining a shifting step according to a state signal. The selecting circuit is utilized for selecting a converting element from the M converting elements by means of separating the selected converting element from a last selected converting elements of the M converting elements by the shifting-step. The state signal is in a first state when selected numbers respectively representing selected times that the M converting elements have been selected for performing the digital to analog conversion are all equal, and is in a second state when the selected numbers are not all equal. The step-calculating circuit determines the shifting-step according to a number of the M converting elements and the multi-bit digital input signal when the state signal is in the first state, and determines the shifting-step according to a first predetermined value when the state signal is in the second state. M represents a positive integer. N represents an integer, and $0 \leq N \leq M$.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a diagram illustrating an example of the operation of the element-selecting method.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
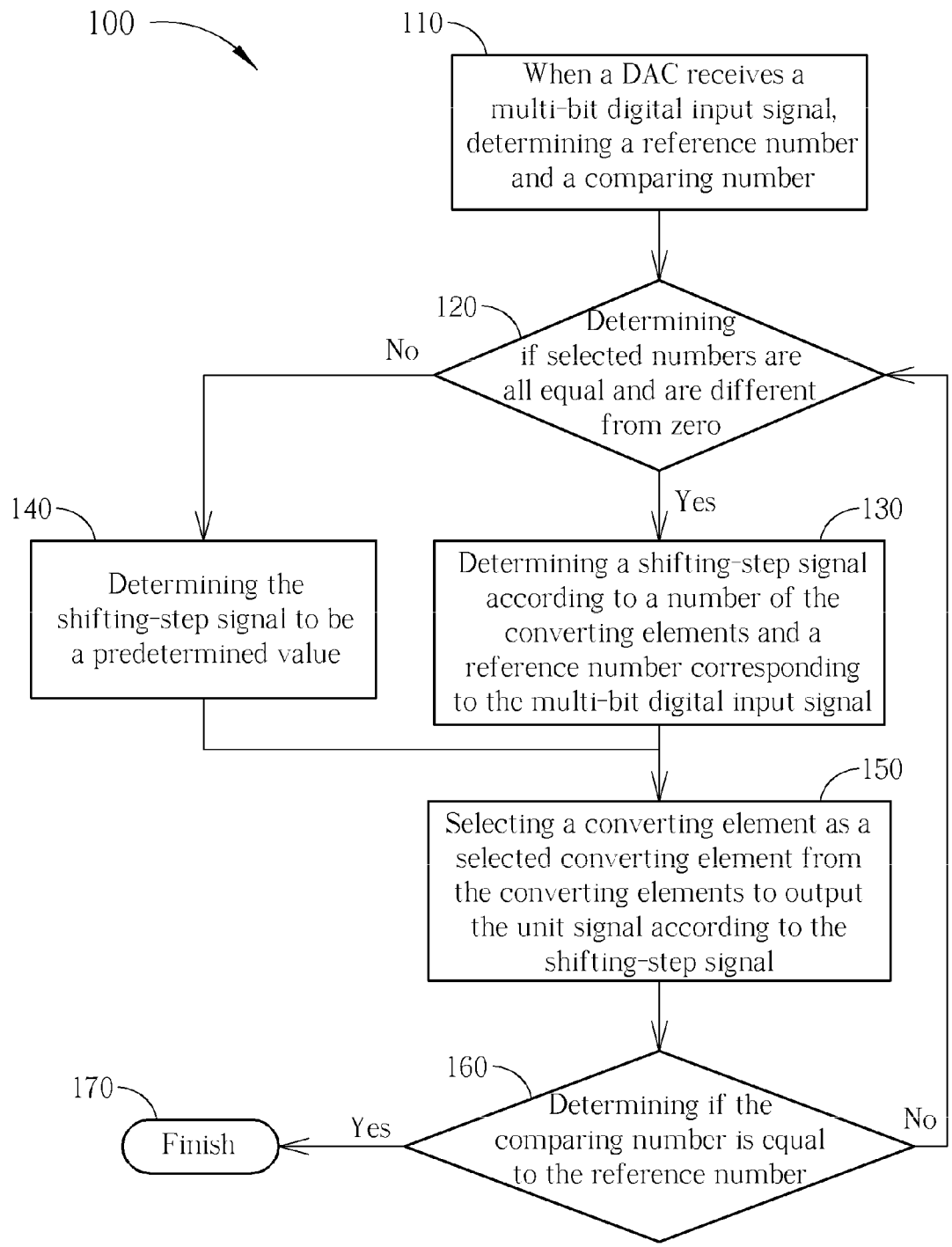
FIG. 1 is a flow-chart diagram illustrating an element-selecting method of the present invention.

Please refer to FIG. 1. FIG. 1 is a flow-chart diagram illustrating an element-selecting method 100 capable of reducing a toggle rate of a Digital to Analog Converter (DAC). The DAC is an over-sampling current-mode DAC. The DAC is utilized for converting a multi-bit digital input signal $S_{IN}$ into an analog output signal $S_{OUT}$. The DAC has converting elements $EL_1 \sim EL_M$, wherein M represents a positive integer. It is assumed that N converting elements of the converting elements $EL_1 \sim EL_M$ are selected to output unit signals $S_{U1} \sim S_{UN}$ when the DAC receives the multi-bit digital input signal $S_{IN}$, wherein $0 \leq N \leq M$. The unit signals $S_{U1} \sim S_{UN}$ are actually current signals, which means the unit signals $S_{U1} \sim S_{UN}$ are unit currents $I_{U1} \sim I_{UN}$, respectively. The magnitudes of the unit currents $I_{U1} \sim I_{UN}$ are all substantially equal and the unit currents $I_{U1} \sim I_{UN}$ are combined for forming the analog output signal $S_{OUT}$. Since a person with ordinary skill in the art can readily appreciate the architecture of the over-sampling current-mode DAC after reading above disclosure, detailed description of the structure of the converting elements is omitted here for brevity. The element-selecting method 100 is utilized for selecting the N selected converting elements from the converting elements $EL_1 \sim EL_M$. Generally, the element-selecting method 100 selects the selected converting elements by a successive manner before all converting elements $EL_1 \sim EL_M$ are used one time. For example, when the DAC receives an input signal representing "3", the first three converting elements $EL_1 \sim EL_3$ are selected. Then, when an input signal representing "4" is received, the next four converting elements $EL_4 \sim EL_7$ are selected. Therefore, the aforementioned "successive manner" means that the start of the current selected converting elements (e.g. $EL_4$) is successive to the end of last selected converting elements (e.g. $EL_3$). The element-selecting method 100 starts to select the selected converting elements by a non-successive manner only if each converting element has been selected. That is, the start of the current selected converting elements is not successive to the end of last selected converting elements. The spacing between the start of the current selected converting elements and the end of last selected converting elements is not fixed and may depend on the value that the received input signal represents.

Provided that substantially the same result is achieved, the steps of the flowchart shown in FIG. 1 need not be in the exact order shown and need not be contiguous, that is, other steps can be intermediate. The procedure of the element-selecting method 100 is illustrated as follows:

step 110: when the DAC receives the multi-bit digital input signal $S_{IN}$, determining a reference number $N_R$ according to the multi-bit digital input signal $S_{IN}$ and determining a comparing number $N_C$ according to a predetermined value $PV_1$;

step 120: determining if selected numbers $N_{SEL1} \sim N_{SELM}$ corresponding to the converting elements $EL_1 \sim EL_M$ are all equal and are different from zero; if yes, go to step 130; otherwise, go to the step 140.

step 130: determining a shifting-step signal $S_{STEP}$ according to a number of the converting elements $EL_1 \sim EL_M$ (i.e., M) and the reference number $N_R$ corresponding to the multi-bit digital input signal $S_{IN}$; go to the step 150;

step 140: determining the shifting-step signal $S_{STEP}$ to be a predetermined value $PV_2$;

step 150: selecting a converting element $EL_i$ as a selected converting element from the converting elements $EL_1 \sim EL_M$ to output the unit signal by means of separating the selected converting element from a last selected converting element of the converting elements $EL_1 \sim EL_M$ by the shifting-step signal $S_{STEP}$, and then increasing the comparing number $N_C$ by a predetermined value $PV_3$ and increasing the selected number $N_{SELi}$ corresponding to the selected converting element $EL_i$ by a predetermined value $PV_4$;

step 160: determining if the comparing number $N_C$ is equal to the reference number $N_R$; if yes, go to the step 170; otherwise, go back to the step 120;

step 170: finish.

In the step 110, the reference number $N_R$ represents the number of the converting elements has to be selected to output the unit signals. For example, the reference number $N_R$ is equal to the value (for example, N) represented by the multi-bit digital input signal $S_{IN}$. The predetermined value $PV_1$ is zero so that the comparing number $N_C$ is reset to be zero in the step 110.

In the step 120, the selected numbers $N_{SEL1} \sim N_{SELM}$ respectively represent the selected times that the corresponding converting elements $EL_1 \sim EL_M$ are selected to output the unit signal. For example, when the converting element $EL_1$ has been chosen for performing the digital-to-analog conversion for ten times, the selected number $N_{SEL1}$ corresponding to the converting element $EL_1$ represents a value of 10. When the converting element $EL_2$ has been chosen for performing the digital-to-analog conversion for nine times, the selected number $N_{SEL2}$ corresponding to the converting element $EL_2$ represents a value of 9. The selected numbers $N_{SEL1} \sim N_{SELM}$ are initially set as zero. Hence, when the converting elements $EL_1 \sim EL_M$ are all selected and the selection times are the same, the selected numbers $N_{SEL1} \sim N_{SELM}$ will be all equal and different from zero.

In the step 130, when the selected numbers $N_{SEL1} \sim N_{SELM}$ are all equal and the selected numbers $N_{SEL1} \sim N_{SELM}$ are different from zero, the shifting-step signal $S_{STEP}$ is determined according to the following formula:

$$S_{STEP} = M - N_R \qquad (1);$$

hence, it can be seen that the shifting-step signal $S_{STEP}$ is determined according to the number of the converting elements $EL_1 \sim EL_M$ and the reference number $N_R$ corresponding to the multi-bit digital input signal $S_{IN}$.

In the step 140, the predetermined value $PV_2$ is zero. That is, when the selected numbers $N_{SEL1} \sim N_{SELM}$ are not all equal or when the selected numbers $N_{SEL1} \sim N_{SELM}$ are all zero, the shifting-step signal $S_{STEP}$ is determined to be zero.

In the step 150, a converting element $EL_i$ is selected from the converting elements $EL_1 \sim EL_M$ to output the unit signal by means of separating the selected converting element from a last selected converting element of the converting elements $EL_1 \sim EL_M$ by the shifting-step signal $S_{STEP}$. More particularly, when the shifting-step signal $S_{STEP}$ is determined according to formula (1) in the step 130, the converting element $EL_i$ is selected by means of separating the selected converting elements from a last selected converting element by the shifting-step signal $S_{STEP}$, when the shifting-step signal $S_{STEP}$ is determined to be zero in the step 140, the converting element following the last selected converting element is selected.

Figure 2:
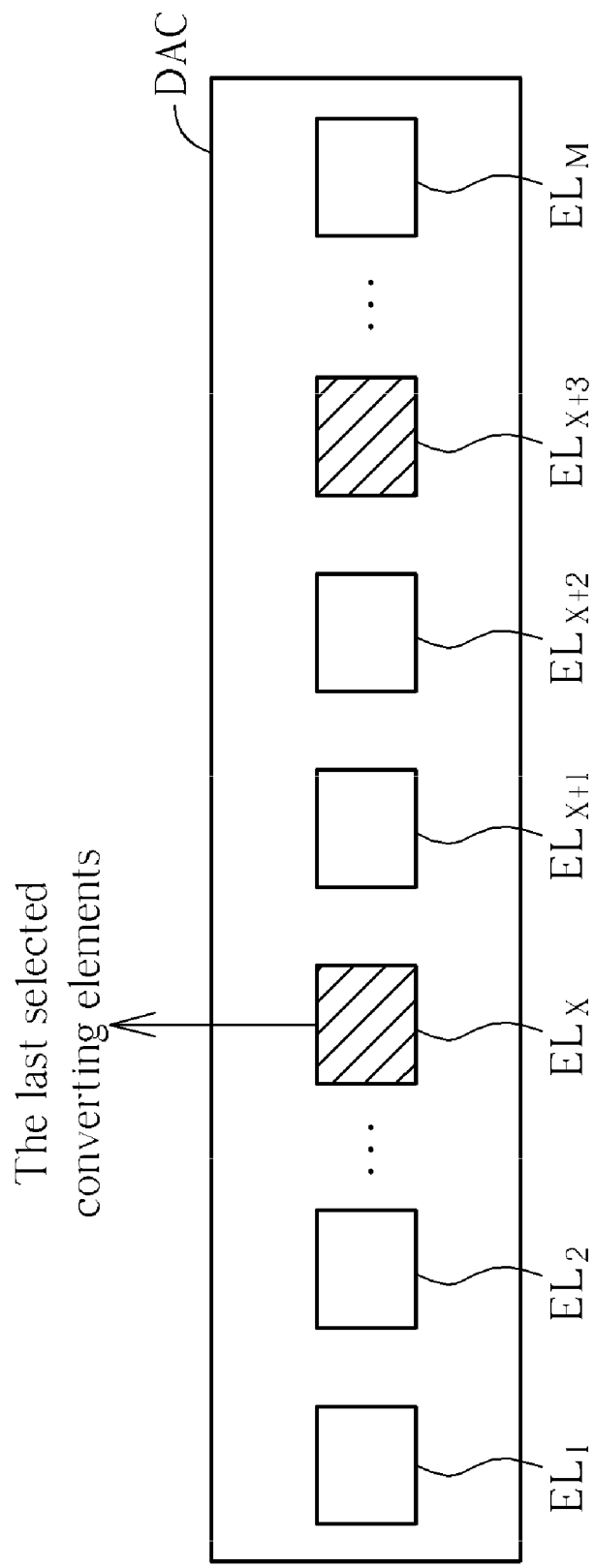
FIG. 2 is a diagram illustrating the converting element selected by means of separating the converting element from the last selected converting element by the shifting-step signal.

For example, please refer to FIG. 2. FIG. 2 is a diagram illustrating the converting element selected by means of separating the converting element from the last selected converting element by the shifting-step signal $S_{STEP}$. In this embodiment, the shifting-step signal $S_{STEP}$ is equal to 2 and the last selected converting element is $EL_X$ at the time. Hence, the converting element $EL_{(X+3)}$ is selected to output the unit signal according to the last selected converting element $E_X$ and the shifting-step signal $S_{STEP}$. The converting element $EL_{(X+3)}$ is separated from the last selected converting element is $EL_X$ by the shifting-step signal $S_{STEP}$. In addition, after the converting element $EL_{(X+3)}$ is selected, the comparing number $N_C$ increases by the predetermined value $PV_3$, wherein the predetermined value $PV_3$ is equal to 1. The selected number $N_{SEL(X+4)}$ corresponding to the converting element $EL_{(X+4)}$ increases by 1 as well.

In the step 160, the reference number $N_R$ equal to the value N represented by the multi-bit digital input signal $S_{IN}$ and the comparing number $N_C$ equal to the number of converting elements that have been selected so far are compared. When the comparing number $N_C$ is equal to the reference number $N_R$, it represents the number of selected converting elements is equal to the value N represented by the multi-bit digital input signal $S_{IN}$. Therefore, the selecting process 100 goes to step 170 to be finished. Meanwhile, the selected converting elements output the corresponding unit signals to represent the analog output signal $S_{OUT}$. On the other hand, when the comparing number $N_C$ is not equal to the reference number $N_R$, the process 100 goes back to the step 120 and another converting element will be selected.

Figure 3:
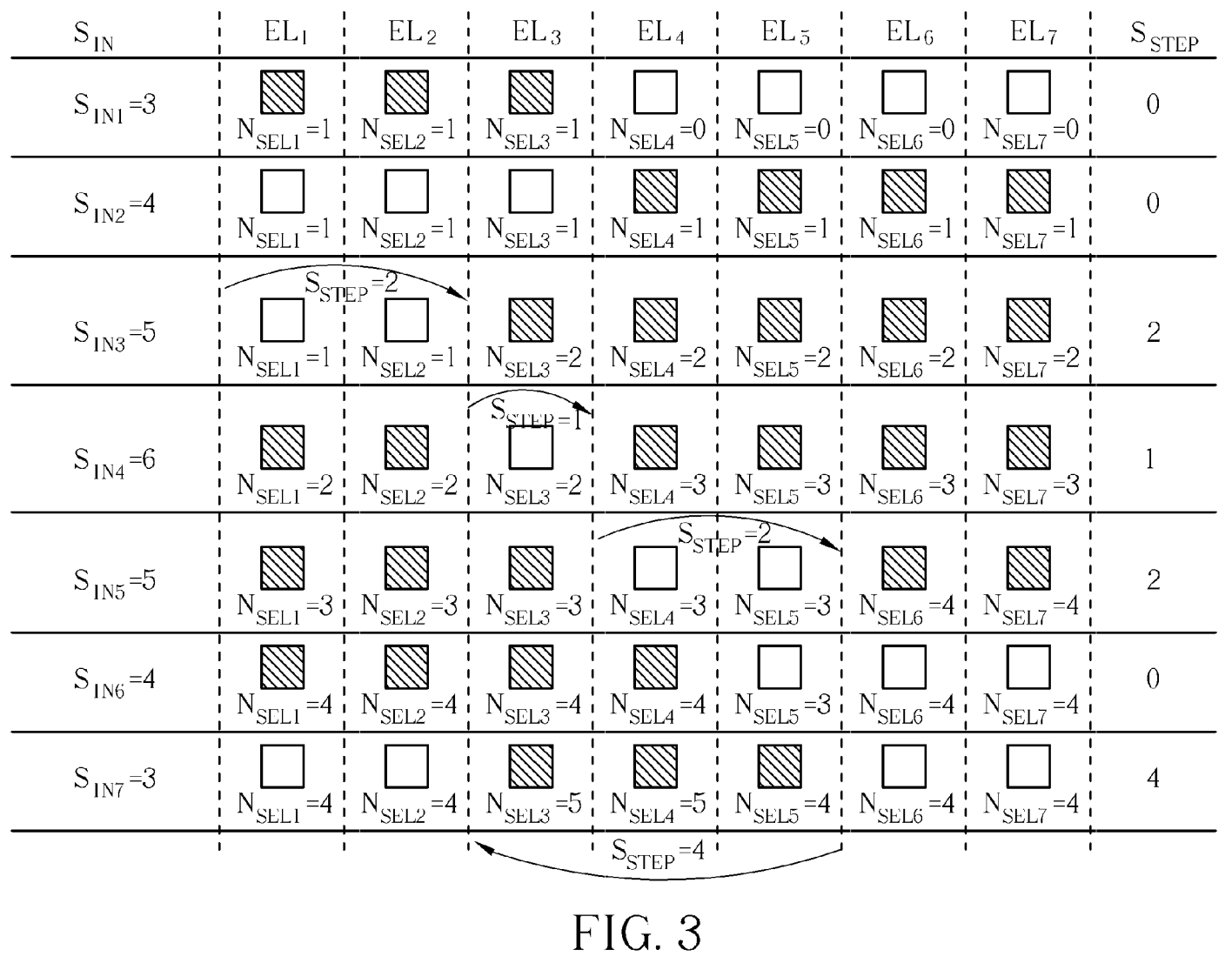

Please refer to FIG. 3. FIG. 3 is a diagram illustrating an example of the operation of the element-selecting method 100. In this embodiment, M (the number of the converting elements $EL_1$~$EL_M$ of the DAC) is equal to 7 and multi-bit digital input signals $S_{IN1}$~$S_{IN7}$ are sequentially inputted into the DAC. The predetermined values $PV_1$, $PV_2$, $PV_3$ and $PV_4$ are respectively equal to 0, 0, 1, and 1. The converting element is represented by a square, wherein an oblique-lined square represents a selected converting element and a blank square represents an unselected converting element. The numbers below the squares represent the selected numbers $N_{SEL1}$~$N_{SEL7}$ corresponding to the converting elements $EL_1$~$EL_7$. Initially, the selected numbers $N_{SEL1}$~$N_{SEL7}$ are all equal to zero.

When the DAC receives the input signal $S_{IN1}$ which represents a value of 3, the converting elements $EL_1$, $EL_2$, and $EL_3$ are sequentially selected according to the steps 110-170. More particularly, when the DAC receives the input signal $S_{IN1}$, the reference number $N_R$ is set to be 3 and a comparing number $N_C$ is set to be zero according to the step 110. Since the selected numbers $N_{SEL1}$~$N_{SEL7}$ are equal to zero at the time, the shifting-step signal $S_{STEP}$ is determined to be zero in the step 140. The converting element $EL_1$ is selected according to the shifting-step signal $S_{STEP}$ representing zero. Meanwhile, the selected number $N_{SEL1}$ becomes 1 and the comparing number $N_C$ becomes 1 according to the step 150. In the step 160, because the comparing number $N_C$ (equal to 1) is not equal to the reference number $N_R$ (equal to 3) at the time, the selecting process goes back to the step 120. The selected number $N_{SEL1}$ is equal to 1 and the other selected numbers are equal to zero. As a result, the shifting-step signal $S_{STEP}$ is determined to be zero according to the steps 140 again. Since the last selected converting element is $EL_1$ and the shifting-step signal $S_{STEP}$ is zero, the converting element $EL_2$ following (next to) the last selected converting element $EL_1$ is selected. Meanwhile, the selected number $N_{SEL2}$ becomes 1 and the comparing number $N_C$ becomes 2 (In the step 150). The comparing number $N_C$ (equal to 2) is not equal to the reference number $N_R$ (equal to 3) at the time. Thus, the selecting process goes back to the step 120 and step 140 again. The selected numbers $N_{SEL1}$ and $N_{SEL2}$ are equal to 1 and the other selected numbers are equal to zero, so that the shifting-step signal $S_{STEP}$ is determined to be zero according to the steps 140. The converting element $EL_3$ next to the last selected converting element $EL_2$ is selected according to the shifting-step signal $S_{STEP}$ representing zero. Meanwhile, the selected number $N_{SEL3}$ becomes 1 and the comparing number $N_C$ becomes 3. Since the comparing number $N_C$ (equal to 3) is equal to the reference number $N_R$ (equal to 3) at the time, the element-selecting method 100 goes to step 170 and finishes selecting the converting elements. In this way, the selected converting elements $EL_1$~$EL_3$ of the DAC are utilized to output unit signals respectively and the analog output signal $S_{OUT}$ is formed by the unit signals outputted by the selected converting elements $EL_1$~$EL_3$.

When the DAC receives the input signal $S_{IN2}$ which represents a value of 4, the converting elements $EL_4$, $EL_5$, $EL_6$, and $EL_7$ are sequentially selected according to the steps 110~170. Similarly, the converting elements $EL_4$ next to the last selected converting element $EL_3$ is selected at first (in the step 150) because the shifting-step signal $S_{STEP}$ is determined to be zero in the step 140, and then the converting elements $EL_5$~$EL_7$ are selected in sequence according to the steps 120~160. In this way, the selected converting elements $EL_4$~$EL_7$ of the DAC output unit signals respectively and the analog output signal $S_{OUT}$ is formed by the unit signals outputted by the selected converting elements $EL_4$~$EL_7$.

When the DAC receives the input signal $S_{IN3}$ which represents a value of 5, the converting elements $EL_3$~$EL_7$ are selected. More particularly, when the DAC receives the input signal $S_{IN3}$, the reference number $N_R$ is set to be 5 and a comparing number $N_C$ is set to be zero according to the step 110. It is noticeable that the selected numbers $N_{SEL1}$~$N_{SEL7}$ are all equal to 1 at the time, which means each of the converting elements $EL_1$~$EL_7$ has been selected for one time. Consequently, the shifting-step signal $S_{STEP}$ is determined by the formula (1) so that the shifting-step signal $S_{STEP}$ becomes 2 ($M-N_R$). In this way, according to the step 150, the converting element $EL_3$ is selected as the last selected converting element is $EL_7$ and the shifting-step signal $S_{STEP}$ is equal to 2. The selected number $N_{SEL3}$ becomes 2 and the comparing number $N_C$ becomes 1. In the step 160, because the comparing number $N_C$ (equal to 1) is not equal to the reference number $N_R$ (equal to 5) at the time, the selecting process goes back to the step 120. The selected number $N_{SEL3}$ is equal to 2 and the other selected numbers are equal to 1. Hence, the shifting-step signal $S_{STEP}$ is determined to be zero (step 140). The last selected converting element is $EL_3$ and the shifting-step signal $S_{STEP}$ is zero, so that the converting element $EL_4$ following the last selected converting element is $EL_3$ is selected according to the step 150. Meanwhile, the selected number $N_{SEL4}$ becomes 2 and the comparing number $N_C$ becomes 2. Since the comparing number $N_C$ (equal to 2) is not equal to the reference number $N_R$ (equal to 5) at the time, it represents the selecting process is not finished and the steps 120~160 are repeated again. Similarly, the converting element $EL_5$~$EL_7$ are selected in sequence. In this way, the selected converting elements $EL_3$~$EL_7$ of the DAC are utilized to output unit signals respectively and the analog output signal $S_{OUT}$ is formed by those unit signals.

When the DAC receives the input signal $S_{IN4}$ representing a value of 6, the converting elements $EL_1$~$EL_2$, and $EL_4$~$EL_7$ are selected. More particularly, when the DAC receives the input signal $S_{IN4}$, the reference number $N_R$ is set to be 6 and a comparing number $N_C$ is set to be zero according to the step 110. Since the selected numbers $N_{SEL1}$ and $N_{SEL2}$ are equal to 1 and the other selected numbers are equal to 2, the shifting-step signal $S_{STEP}$ is determined to be zero according to the step 140. Hence, the converting element $EL_1$ is selected because the last selected converting element is $EL_7$ and the shifting-step signal $S_{STEP}$ is zero. The selected number $N_{SEL1}$ becomes 2 and the comparing number $N_C$ becomes 1. The comparing number $N_C$ is not equal to the reference number $N_R$. Therefore, the steps 120~160 are repeated again and the converting element $EL_2$ is selected similarly. Meanwhile, since the selected numbers $N_{SEL1}$~$N_{SEL7}$ are all equal to 2 at the time, it represents all the converting elements $EL_1$~$EL_7$ have been selected twice. Hence, the shifting-step signal $S_{STEP}$ is determined to be 1 according to the formula (1). In this way, the converting element $EL_4$ separating from the last selected converting element $EL_2$ by the shifting-step signal $S_{STEP}$ representing 1 is selected (step 150). The selected number $N_{SEL4}$ becomes 3 and the comparing number $N_C$ becomes 3. The comparing number $N_C$ is not equal to the reference number $N_R$. Thus, the steps 120-160 are repeated again. Similarly, the converting elements $EL_5$~$EL_7$ are selected in sequence. In this way, the selected converting elements $EL_1$~$EL_2$, and $EL_4$~$EL_7$ of the DAC are utilized to output unit signals respectively and the analog output signal $S_{OUT}$ is formed by those unit signals.

When the DAC receives the input signal $S_{IN5}$~$S_{IN7}$, the converting elements are determined in a similar way. The detailed description is omitted for brevity. In FIG. 3, it can be seen that the shifting-step signal $S_{STEP}$ is determined to be zero when the selected numbers $N_{SEL1}$~$N_{SEL7}$ are not equal. That is, the shifting-step signal $S_{STEP}$ keeps zero until the selected times of the converting element $EL_1$~$EL_7$ are all equal. In other words, the element-selecting method 100 of the present invention balances the selected times of the converting element $EL_1$~$EL_1$ for eliminating the error accumulated because of the mismatch of the converting elements $EL_1$~$EL_7$. However, when the selected numbers $N_{SEL1}$~$N_{SEL7}$ are all equal, the shifting step signal $S_{STEP}$ becomes (M–$N_R$), wherein M is equal to 7 in the example. In this way, the last selected converting element in the present round is determined to be the last selected converting element in the previous round when the selected times corresponding the converting element $EL_1$~$EL_7$ are equal. For example, in the round of the input signal $S_{IN2}$, the last selected converting element is the converting element $EL_7$ and in the round of the input signal $S_{IN3}$, the last selected converting element is the converting element $EL_7$ as well. In the round of the input signal $S_{IN4}$, the last selected converting element is also the converting element $EL_7$, just like in the input signal $S_{IN3}$. In addition, in the round of the input signal $S_{IN6}$, the last selected converting element is the converting element $EL_4$ and in the round of the input signal $S_{IN7}$, the last selected converting element is the converting element $EL_4$ as well. In this way, repetition of the converting elements selected in two adjacent rounds increases. That is, the probability, that a converting element is selected to output the unit signal in two adjacent rounds, is raised up. In other words, the toggle rate, which means the averaged number of elements of DAC changing their states in one conversion step, of the DAC is reduced by means of the element-selecting method 100 of the present invention. Therefore, glitch and the dynamic errors are reduced, improving the performance of the DAC.

Figure 4:
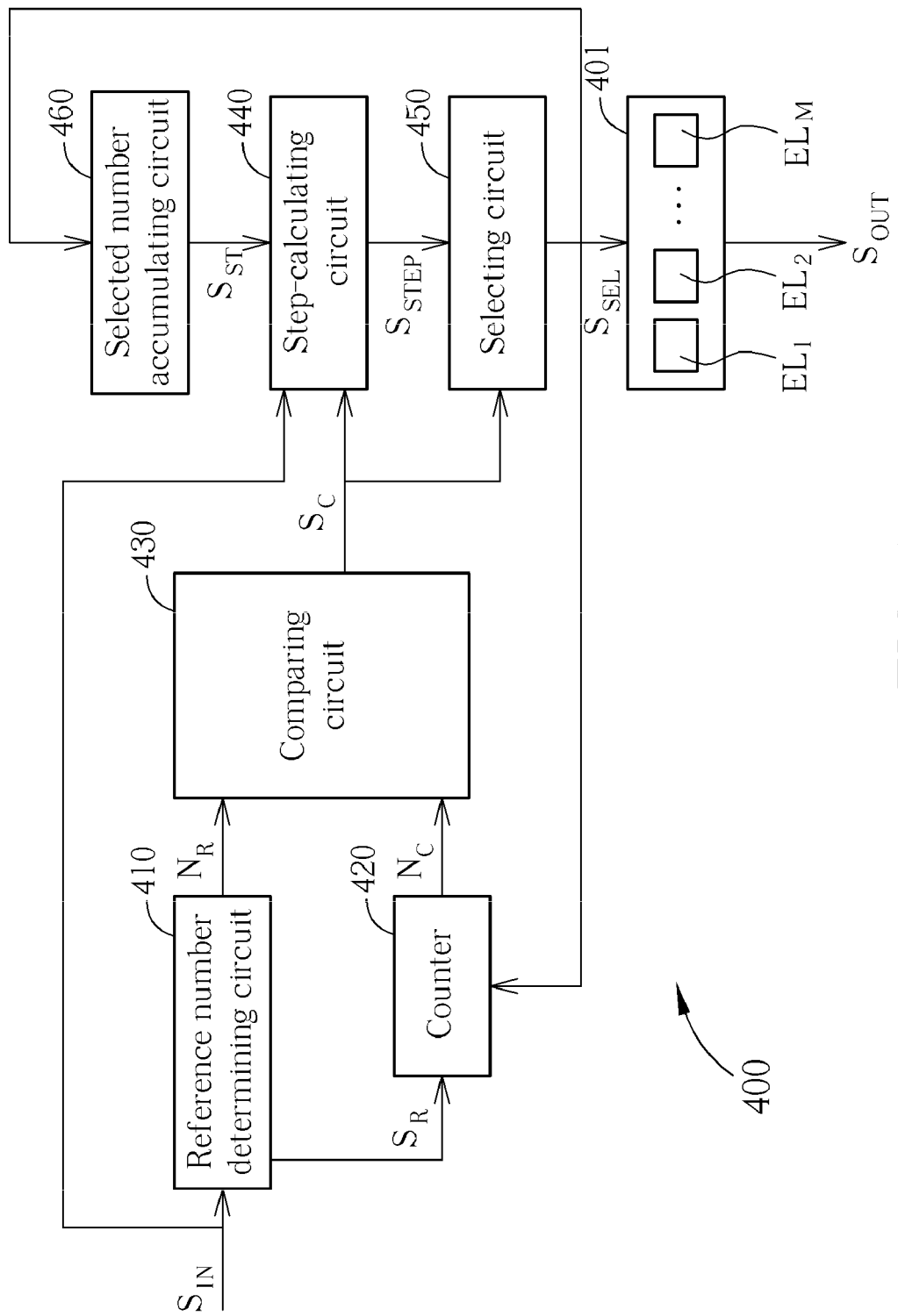
FIG. 4 is a diagram illustrating an element-selecting module of the present invention.

Please refer to FIG. 4. FIG. 4 is a diagram illustrating an element-selecting module 400 capable of reducing the toggle rate of the DAC 401. The DAC 401 is an over-sampling current-mode DAC. The DAC 401 is utilized for converting a multi-bit digital input signal $S_{IN}$ into an analog output signal $S_{OUT}$. The DAC has converting elements $EL_1$~$EL_M$, wherein M represents a positive integer. The element-selecting module 400 is utilized for selecting N converting elements from the converting elements $EL_1$~$EL_M$ according to the input signal $S_{IN}$. The N selected converting elements of the converting elements $EL_1$~$EL_M$ output unit signals $S_{U1}$~$S_{UN}$ (not shown). The unit signals $S_{U1}$~$S_{UN}$ are unit currents $I_{U1}$~$I_{UN}$, respectively. The magnitudes of the unit currents $I_{U1}$~$I_{UN}$ are all substantially equal and the unit currents $I_{U1}$~$I_{UN}$ are combined for forming the analog output signal $S_{OUT}$. The element-selecting module 400 comprises a reference number determining circuit 410, a counter 420, a comparing circuit 430, a step-calculating circuit 440, a selecting circuit 450, and a selected number accumulating circuit 460. When the element-selecting module 400 receives the multi-bit digital input signal $S_{IN}$, the reference number determining circuit 410 determines a reference number $N_R$ according to the multi-bit digital input signal $S_{IN}$ and generating a resetting signal $S_R$. For example, the reference number $N_R$ is equal to the value represented by the multi-bit digital input signal $S_{IN}$. The counter 420 outputs a comparing number $N_C$. When the counter receives the resetting signal $S_R$, the comparing number $N_C$ is reset to be the predetermined value $PV_1$ (for example, the predetermined value $PV_1$ is zero). When the counter 420 receives a selecting signal $S_{SEL1}$, the comparing number $N_C$ increases by the predetermined value $PV_3$ (for example, the predetermined value $PV_3$ is 1). The comparing circuit 430 compares the reference number $N_R$ and the comparing number $N_C$ and accordingly generating a control signal $S_C$. More particularly, when the reference number $N_R$ and the comparing number $N_C$ are not equal, the comparing circuit 430 generates the control signal $S_C$ to enable the step-calculating circuit 440 to generate a shifting step signal $S_{STEP}$. The step-calculating circuit 440 calculates the shifting-step signal $S_{STEP}$ according to M (the number of the converting elements $EL_1$~$EL_M$) and the multi-bit digital input signal $S_{IN}$, the predetermined value $PV_2$ (for example, zero) and a state signal $S_{ST}$. The selecting circuit 450 generates a selecting signal $S_{SEL}$ so as to select a converting element from the converting elements $EL_1$~$EL_M$ to output the unit signal by means of separating the selected converting element from a last selected converting element of the converting elements $EL_1$~$EL_M$ by a step represented by the shifting-step signal $S_{STEP}$. More particularly, the selecting signal $S_{SEL}$ is utilized for indicating that which converting element is selected to output the unit signal. The selected number accumulating circuit 460 accumulates the selected numbers $N_{SEL1}$~$N_{SELM}$ respectively corresponding to the converting elements $EL_1$~$EL_M$ according to the selecting signal $S_{SEL}$, and the selected number accumulating circuit 460 accordingly outputs the state signal $S_{ST}$. For example, when the selected numbers $N_{SEL1}$~$N_{SELM}$ are all equal, the state signal $S_{ST}$ represents "calculating"; when the selected numbers $N_{SEL1}$~$N_{SELM}$ are not equal, the state signal $S_{ST}$ represents "resetting". Furthermore, when the state signal $S_{ST}$ represents "calculating", the step-calculating circuit 440 calculates the shifting-step signal $S_{STEP}$ according to the formula (1). When the state signal $S_{ST}$ represents "resetting", the step-calculating circuit 440 resets the shifting-step signal $S_{STEP}$ to be the predetermined value $PV_2$ (zero). In addition, when the counter 420 receives the selecting signal $S_{ST}$, the counter 420 increases the comparing number $N_C$ by the predetermined value $PV_3$ (one). As a result, in the element-selecting module 400, the reference number determining circuit 410 determines the reference number $N_R$ and the comparing number $N_C$. The comparing circuit 430 controls the step-calculating circuit 440 continuously calculating the shifting-step signal $S_{STEP}$ and the selecting circuit 450 continuously selecting a converting element according to the shifting-step signal $S_{STEP}$ until the comparing number $N_C$ is equal to the reference number $N_R$. In addition, the step-calculating circuit 440 determines if the selected numbers $N_{SEL1}$~$N_{SELM}$ are all equal according to the state signal $S_{ST}$. When the selected numbers $N_{SEL1}$~$N_{SELM}$ are not all equal, the step-calculating circuit 440 determines the shifting-step signal $S_{STEP}$ to be zero; when the selected numbers $N_{SEL1}$~$N_{SELM}$ are all equal, the step-calculating circuit 440 determines the shifting-step signal $S_{STEP}$ to be (M−$N_R$). In this way, the element-selecting module 400 selects the converting elements in a similar way like the element-selecting method 100 of the present invention. Thus, in the DAC 401, the number of the converting elements selected in two adjacent rounds increases by means of the element-selecting module 400. Hence, the toggle rate of the DAC 401 is reduced, and the glitch and the dynamic errors are reduced, improving the performance of the DAC.

In conclusion, the present invention provides an element-selecting method for selecting the converting elements of the DAC to output the unit signals. The element-selecting method determines if the selected times of the converting elements are all equal. When the selected times of the converting elements are all equal, the element-selecting method determines a shifting-step signal according to the input signal and the number of the converting elements; otherwise, the element-selecting method determines the shifting-step signal to be a predetermined value. The element-selecting method selects a converting element from the DAC by means of separating the converting element from a last selected converting element by the shifting-step signal. In this way, the error accumulated because of the mismatch of the converting elements is eliminated, and the toggle rate of the DAC is reduced as well. Hence, the glitch and the dynamic errors of the DAC are reduced, improving the performance of the DAC.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An element-selecting method applied to a Digital to Analog Converter (DAC), wherein the DAC is utilized for converting a multi-bit digital input signal into an analog output signal, the DAC has M converting elements, and N converting element(s) of the M converting elements are selected for performing digital to analog conversion when the DAC receives the multi-bit digital input signal, the element-selecting method comprising:
   (a) determining a shifting-step according to a first predetermined value when selected numbers corresponding to the M converting elements are different, wherein the selected numbers respectively represent selected times that the M converting elements have been selected for performing the digital to analog conversion;
   (b) determining the shifting-step according to a number of the M converting elements and the multi-bit digital input signal when the selected numbers corresponding to the M converting elements are all equal; and
   (c) selecting a converting element from the M converting elements by means of separating the selected converting element from a last selected converting element of the M converting elements by the shifting-step;
   where M represents a positive integer; N represents an integer and 0≦N≦M.

2. The element-selecting method of claim 1, further comprising:
   determining a reference number according to the multi-bit digital input signal, and determining a comparing number according a second predetermined value;
   increasing the comparing number by a third predetermined value each time a converting element is selected from the M converting elements; and
   repeating the steps (a) to (c) until the comparing number is equal to the reference number.

3. The element-selecting method of claim 2, wherein the first predetermined value is equal to zero; the second predetermined value is equal to zero; the third predetermined value is equal to one.

4. The element-selecting method of claim 1, wherein step (b) comprises:
   determining the shifting-step according to a following formula when the selected numbers are all equal:

$S_{STEP}=M-N_R$, wherein $S_{STEP}$ represents shifting-step; M is the number of the M converting elements; $N_R$ is a reference number represented by the multi-bit digital input signal.

5. The element-selecting method of claim 1, wherein the DAC is a current-mode DAC.

6. The element-selecting method of claim 1, wherein the DAC is an over-sampling DAC.

7. An element-selecting module applied to a Digital to Analog Converter (DAC), wherein the DAC is utilized for converting a multi-bit digital input signal into an analog output signal, the DAC has M converting elements, and the element-selecting module selects N converting elements from the M converting elements for performing digital to analog conversion when the DAC receives the multi-bit digital input signal, the element-selecting module comprising:
   a step-calculating circuit, for determining a shifting-step according to a state signal; and
   a selecting circuit, for selecting a converting element from the M converting elements by means of separating the selected converting element from a last selected converting element of the M converting elements by the shifting-step;
   wherein the state signal has a first state when selected numbers respectively representing selected times that the M converting elements have been selected for performing the digital to analog conversion are all equal, and has a second state when the selected numbers are not all equal;
   wherein the step-calculating circuit determines the shifting-step according to a number of the M converting elements and the multi-bit digital input signal when the state signal is in the first state, and determines the shifting-step according to a first predetermined value when the state signal is in the second state;
   wherein M represents a positive integer; N represents an integer and 0≦N≦M.

8. The element-selecting module of claim 7, further comprising:
   a reference number determining circuit, for determining a reference number according to the multi-bit digital input signal;
   a counter, for outputting a comparing number, wherein when a converting element is selected from the M converting elements, the comparing number increases by a second predetermined value;
   a comparing circuit, for comparing the reference number and the comparing number and accordingly generating a control signal to enable the step-calculating circuit.

9. The element-selecting module of claim 7, wherein when the state signal is in the first state, the step-calculating circuit calculates the shifting-step according to a following formula:

$S_{STEP}=M-N_R$, wherein $S_{STEP}$ represents the shifting-step; M is the number of the M converting elements; $N_R$ is a reference number represented by the multi-bit digital input signal.

10. The element-selecting module of claim 7, wherein when the state signal is in the second state, the step-calculating circuit resets the shifting-step to be the first predetermined value.

11. The element-selecting module of claim 7, wherein the DAC is a current-mode DAC.

12. The element-selecting module of claim 7, wherein the DAC is an over-sampling DAC.

* * * * *